(12) United States Patent
Kabansky et al.

(10) Patent No.: US 7,351,663 B1
(45) Date of Patent: Apr. 1, 2008

(54) REMOVING WHISKER DEFECTS

(75) Inventors: Alex Kabansky, Santa Clara, CA (US); Hean-Cheal Lee, Pleasanton, CA (US); Sundar Narayanan, Santa Clara, CA (US); Prabhuram Gopalan, Milpitas, CA (US); Vinay Krishna, Apple Valley, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/169,176

(22) Filed: Jun. 27, 2005

Related U.S. Application Data

(60) Provisional application No. 60/583,131, filed on Jun. 25, 2004, provisional application No. 60/583,162, filed on Jun. 25, 2004.

(51) Int. Cl.
H01L 21/302 (2006.01)
H01L 21/461 (2006.01)
(52) U.S. Cl. .................................................. 438/706
(58) Field of Classification Search ................. 438/706
See application file for complete search history.

(56) References Cited

U.S. PATENT DOCUMENTS

| | | | |
|---|---|---|---|
| 6,303,483 B1 * | 10/2001 | Kunikiyo | 438/592 |
| 6,410,428 B1 * | 6/2002 | Chiang et al. | 438/655 |
| 6,680,516 B1 | 1/2004 | Blosse et al. | |
| 6,984,575 B2 * | 1/2006 | Yamamoto | 438/585 |
| 2002/0064944 A1 * | 5/2002 | Chung et al. | 438/637 |
| 2004/0110387 A1 * | 6/2004 | Chowdhury | 438/710 |
| 2004/0214448 A1 * | 10/2004 | Chan et al. | 438/725 |

OTHER PUBLICATIONS

S. Wolf and R.N. Tauber, (Silicon Processing for the VLSI Era, vol. 1- Process Technology, Lattice Press, 1986, p. 384)☐☐.*
Encyclopedia of Chemical Technology, Kirk-Othmer, vol. 14, pp. 677-709, (1995).

* cited by examiner

*Primary Examiner*—Duy-Vu N. Deo
*Assistant Examiner*—Mahmoud Dahimene
(74) *Attorney, Agent, or Firm*—Evan Law Group LLC

(57) ABSTRACT

A method of removing a defect from a gate stack on a substrate, comprises treating the gate stack with a plasma. The plasma comprises fluorine, the gate stack comprises a gate layer and a metallic layer, and substantially no photoresist is present on the substrate.

20 Claims, 3 Drawing Sheets

REMOVING WHISKER DEFECTS

CROSS-REFERENCE TO RELATED APPLICATIONS

This application claims priority to provisional application Ser. No. 60/583,131, entitled "A METHOD FOR REMOVING WHISKER-TYPE DEFECTS DEVELOPING DURING SELECTIVE OXIDATION OF POLYSILICON", filed 25 Jun. 2004, and provisional application Ser. No. 60/583,162, entitled "A METHOD OF FORMING A GATE STACK INCLUDING THE STEP OF REMOVING WHISKER-TYPE DEFECTS FOLLOWING SELECTIVE OXIDATION OF POLYSILICON", filed 25 Jun. 2004, the entire contents of both application are hereby incorporated by reference, except where inconsistent with the present application.

BACKGROUND

Developments in semiconductor processing in recent years have steadily decreased the size of features or elements in integrated circuits (ICs). The continuous scaling of very large scale integrated circuit technologies has required dimensions of gates in field effect transistors in integrated circuits and devices to shrink to 45 to 50 nanometers (nm) in order to provide the desired performance.

In memory devices, such as static random access memory (SRAM) and dynamic random access memory (DRAM) technologies, the gate is typically formed from a complex stack of materials including polycrystalline silicon (poly), a metallic layer and an insulating cap. In the latest generation of devices, the process of forming the gates includes a selective oxidation (SELOX) process to selectively oxidize silicon without oxidizing metallic layers, in order to repair damage near the boundary of the gate stack and the gate oxide layer. SELOX can cause formation of whisker and/or bump type defects on the sidewalls of the gate structure, particularly those structures containing tungsten (W) and titanium (Ti). Examples of these defects are shown in FIGS. 1-4.

FIGS. 1-4 are SEM and TEM images of whiskers defects after SELOX on a W-containing gate structure. FIG. 1 is a planar view of a gate structure following SELOX and showing a whisker defect. FIG. 2 is a perspective view of another gate structure following SELOX and showing a whisker. FIG. 3 is a sectional side view of the gate structure of FIG. 1 showing the whisker, and FIG. 4 is a sectional side view of the gate structure and whisker of FIG. 2. These whiskers, which can be as long as the gate to gate spacing, and bump defects, which can be up to 6 nm, remain on the gate and can originate shorts in self-aligned contact (SAC) structures, increasing leakage current in SAC structures, drastically reducing reliability of the devices and leading to failure of the ICs.

Methods of preventing these failures have focused on improving and optimizing the SELOX process to prevent formation of whisker and bump defects. Although this approach has significantly reduced the occurrence of these defects, it has not been wholly successful.

SUMMARY

In a first aspect, the present invention is a method of removing a defect from a gate stack on a substrate, comprising treating the gate stack with a plasma. The plasma comprises fluorine, the gate stack comprises a gate layer, and a metallic layer on the gate layer, and substantially no photoresist is present on the substrate.

In a second aspect, the present invention is a method of forming a semiconductor structure, comprising selectively oxidizing silicon in a gate stack; and treating the gate stack with a plasma. The plasma comprises fluorine, the gate stack comprises a gate layer comprising the silicon and a metallic layer on the gate layer. The treating is carried out after stripping of any photoresist applied on the substrate.

In a third aspect, the present invention is an improvement in a method of forming a semiconductor structure including selectively oxidizing silicon in a gate stack on a substrate, where the gate stack contains the silicon and a metallic layer on the silicon. The improvement comprises treating the gate stack with a plasma containing fluorine when substantially no photoresist is present on the substrate.

DETAILED DESCRIPTION

The present invention make use of the discovery that defects, such as whisker defects and bump defects, may be removed from a gate structure by treatment with a plasma formed from a gas containing fluorine, without damaging the gate stack. This allows for the removal of whisker defects and bumps defects formed on gate electrodes during SELOX. This is accomplished without the need for new process equipment or process gases, and in certain embodiments, without the introduction of new process steps. The method is particularly useful for treating gate stacks which will be included in devices having SAC structures.

Figure 7:
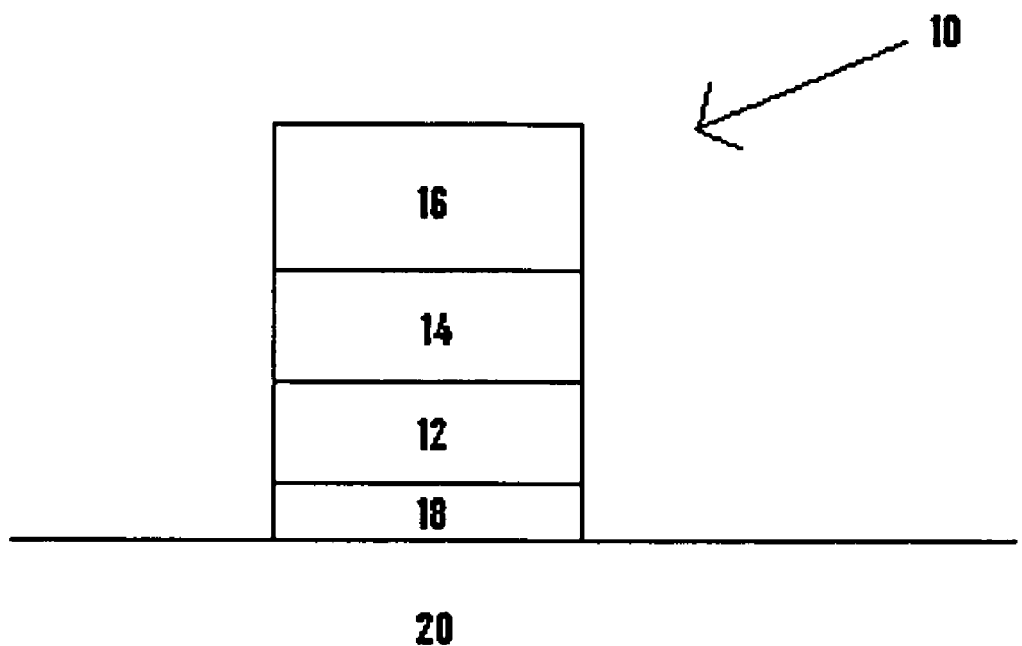
FIG. 7 illustrates a gate stack for a memory device.

Gate stacks for memory devices, such as static random access memory (SRAM) and dynamic random access memory (DRAM) technologies, are typically formed from layers deposited or grown on a gate dielectric layer on a semiconductor substrate, illustrated in FIG. 7. Preferably, the gate stack 10 includes a gate layer 12, at least one metallic layer 14 on the gate layer, and an insulating layer 16 on the metallic layer, all of which are on a gate dielectric layer 18, which is in turn on a semiconductor substrate 20. Preferably, the metallic layer may contain at least one refractory transition metal, such as tungsten, tantalum, titanium, nickel, molybdenum, nitrides thereof, suicides thereof or alloys thereof. Preferably, the gate layer comprises poly and/or silicide; the silicide may form by reaction of the metallic layer with the poly. No poly may remain after reaction, in which case excess metal (such as the refractory transition metal) would be present in the metallic layer. Preferably, the insulating layer contains a nitride, such as silicon nitride. More preferably, the nitride layer, which may act as an etch-stop layer, is deposited by plasma enhanced chemical vapor deposition (see, for example, U.S. Pat. No.

6,680,516). In one preferred embodiment, the gate stack includes W/WN$_x$/Ti/poly layers.

Figure 1:
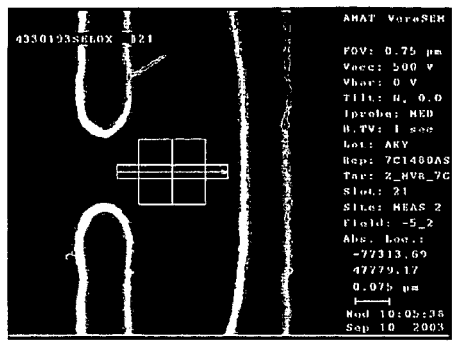
FIG. 1 is an electron microscope image of a planar view of a gate structure following SELOX, processed using a conventional process, showing a whisker defect.
Figure 2:
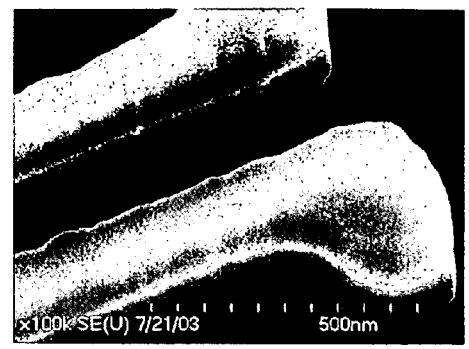
FIG. 2 is an electron microscope image of a perspective view of a gate structure following SELOX, processed using a conventional process, showing a whisker defect.
Figure 3:
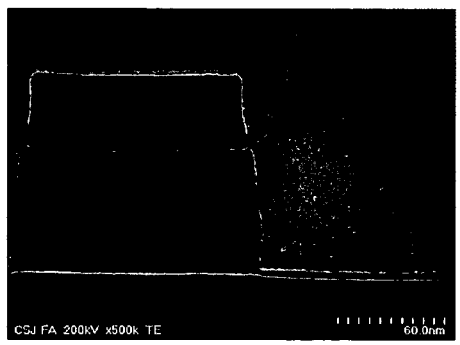
FIG. 3 is a sectional side view of the gate structure of FIG. 1 showing the whisker defect.
Figure 4:
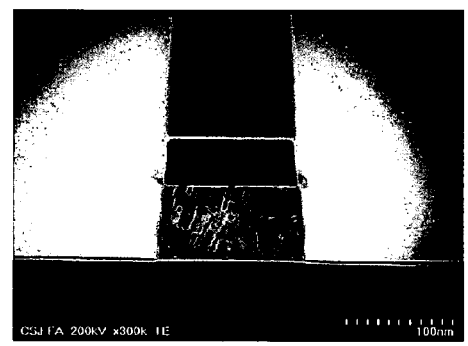
FIG. 4 is a sectional side view of the gate structure of FIG. 2 showing the whisker defect.
Figure 5:
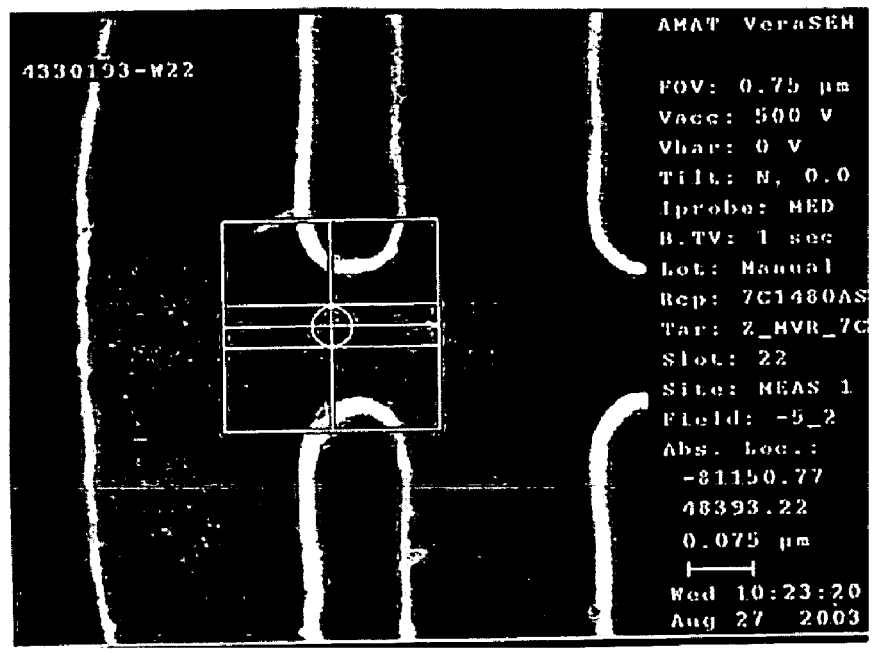
FIG. 5 is an electron microscope image of a planar view of a gate structure following SELOX and showing whisker defects.
Figure 6:
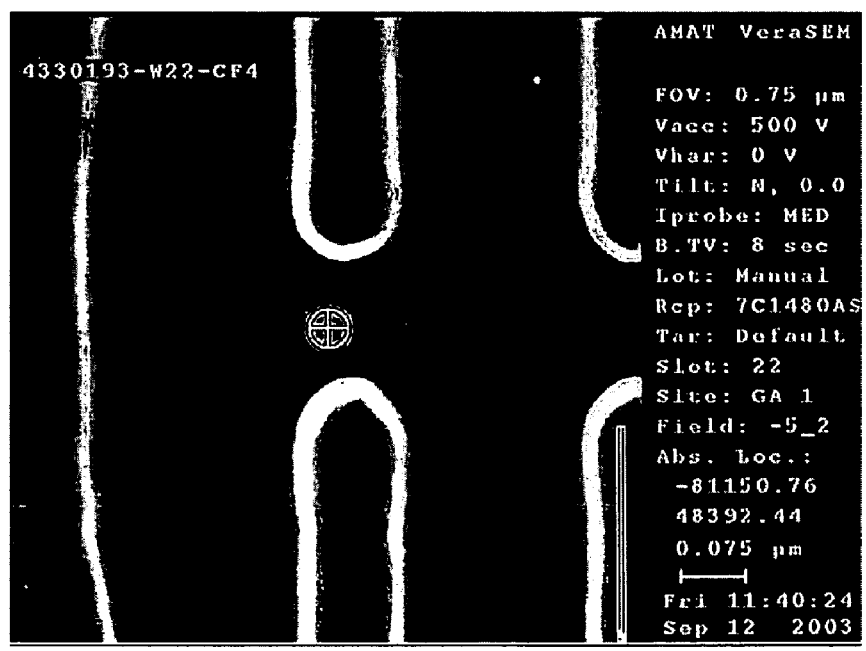
FIG. 6 is another electron microscope image of the gate structure of FIG. 5 after processing, according to an embodiment of the present invention, showing the absence of the whisker defects.

A process according to an embodiment of the present invention for forming a gate stack, will now be described in greater detail with reference to Table 1 and to FIGS. 5 and 6. Table 1 is an embodiment of the present invention, showing sequencing of a process for forming a gate stack including treating the gate stack following SELOX to remove whisker defects and bump defects.

Referring to Table 1 the process begins with a tungsten/tungsten-nitride (W/WN$_x$) mask etch, followed by a SELOX of the poly, and a post SELOX plasma treatment in accordance with the present invention.

TABLE 1

| Sequence | Operation |
| --- | --- |
| 1 | W/WN$_x$ MASK ETCH |
| 2 | SELECTIVE POLY OXIDATION (SELOX) |
| 3 | POST SELOX PLASMA TREATMENT |
| 4 | N$^+$ TIP MASK FORMATION |
| 5 | ARSENIC TIP IMPLANT |
| 6 | BORON HALO IMPLANT |
| 7 | N$^+$ TIP IMPLANT MASK STRIP |
| 8 | N$^+$ TIP MASK FORMATION |
| 9 | ARSENIC TIP IMPLANT |
| 10 | N$^+$ TIP IMPLANT MASK STRIP |
| 11 | P$^+$ TIP MASK FORMATION |
| 12 | BORON TIP IMPLANT |
| 13 | ARSENIC HALO IMPLANT |
| 14 | P$^+$ TIP IMPLANT MASK STRIP |

The plasma treatment includes a plasma formed from a process gas containing a fluorine-containing gas. The fluorine-containing gas may include one or more of, for example, CF$_4$, CHF$_3$, or NF$_3$, and less preferably, fluorinated alkanes or SF$_6$. The process gas may further includes an oxygen-containing gas, such as one or more of O$_2$, water vapor, and/or N$_2$O. Optionally, the process gas may further include a carrier gas that may or may not be inert. Suitable carrier gases include one or more of helium, argon, nitrogen, a hydrogen/nitrogen combination (for example, forming gas) or water vapor.

The plasma may be remotely or directly energized, and can be formed using ICP, TCP, CCP or other plasma sources. Preferably, the temperature of the substrate during the plasma treatment is maintained at room temperature (20° C.) to 300° C. Suitable gas flows include flow for the fluorine-containing gas (such as CF$_4$, NF$_3$ or CHF$_3$) ranging from 2 sccm-100 sccm, for the oxygen-containing gas (such as O$_2$) ranging from 0-4000 sccm or 100-3000 sccm, and for the carrier gas (such as N$_2$/H$_2$) ranging from 0-2000 sccm or 10-3000 sccm. Preferably, treatment time is 10 sec-5 min., at a pressure of 10 to 5000 mTorr, and at a plasma power of 100 W-3000 W.

In the embodiment shown in Table 1, the plasma treatment is performed immediately after SELOX. However, the treatment may be performed anywhere between SELOX and a subsequent spacer deposition process (not shown in Table 1). If any photoresist has been applied to the substrate, the plasma treatment is performed after stripping of the applied photoresist, also referred to as a resist strip, so that substantially no photoresist is present on the substrate during the plasma treatment. For example, in Table 1, during the N$^+$ tip mask formation (sequence no. 4) photoresist is applied, and the photoresist is stripped during the N$^+$ tip implant mask strip (sequence no. 7). Additionally, the treatment may be performed as an independent part of the process, as shown and described above, or may be applied as a sub-part of any other part of the process carried out after SELOX. In particular, the treatment may be applied as a sub-part of any post-SELOX implant mask strips, such as the N$^+$ tip implant mask strip or P$^+$ tip implant mask strip, after substantially no photoresist is present on the substrate.

The ability of the treatment process according to an embodiment of the present invention to remove all or substantially all whisker and bump defects from a gate structure will now be described with reference to FIGS. 5 and 6. FIG. 5 is an electron microscope image of a planar view of a gate stack following SELOX and showing whisker defects. FIG. 6 is another electron microscope image of the gate stack of FIG. 5 after processing according to an embodiment of the present invention and showing the absence of whisker defects.

Other processing may be used to complete formation of semiconductor devices from the semiconductor structure. For example, source/drain regions may be formed in the substrate, additional dielectric layers may be formed on the substrate, and contacts and metallization layers may be formed on these structures. These additional elements may be formed before, during, or after formation of the gate stack.

The related processing steps, including the etching of layers, polishing, cleaning, and depositing, for use in the present invention are well known to those of ordinary skill in the art, and are also described in Encyclopedia of Chemical Technology, Kirk-Othmer, Volume 14, pp. 677-709 (1995); Semiconductor Device Fundamentals, Robert F. Pierret, Addison-Wesley, 1996; Wolf, Silicon Processing for the VLSI Era, Lattice Press, 1986, 1990, 1995 (vols 1-3, respectively), and Microchip Fabrication 4rd. edition, Peter Van Zant, McGraw-Hill, 2000.

The semiconductor structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

The invention claimed is:

1. A method of forming a semiconductor structure, comprising:
    selectively oxidizing silicon in a gate stack, causing formation of a defect; and
    treating the gate stack with a plasma, to remove the defect;
    wherein the plasma comprises fluorine,
    the gate stack comprises
        a gate layer comprising the silicon, and
        a metallic layer, on the gate layer, and
    the treating is carried out after stripping of any photoresist applied on the substrate.

2. The method of claim 1, wherein the plasma further comprises oxygen.

3. The method of claim 1, further comprising forming an insulating layer, on the metallic layer.

4. The method of claim 1, wherein the metallic layer comprises at least at least one member selected from the group consisting of tungsten, tantalum, titanium, nickel, molybdenum, nitrides thereof, silicides thereof or alloys thereof.

5. The method of claim 3, wherein the insulating layer comprises silicon nitride,
    the metallic layer comprises tungsten and titanium, and
    the gate layer comprises poly.

6. The method of claim 1, wherein the plasma is prepared from a process gas comprising at least one member selected from the group consisting of CF$_4$, CHF$_3$ and NF$_3$.

7. The method of claim 2, wherein the plasma is prepared from a process gas comprising:
   at least one member selected from the group consisting of $CF_4$, $CHF_3$ and $NF_3$,
   at least one member selected from the group consisting of $O_2$, water vapor, and $N_2O$, and
   nitrogen or a combination of nitrogen and hydrogen.

8. The method of claim 5, further comprising forming a self-aligned contact structure on the substrate.

9. A method of making a semiconductor device, comprising:
   forming a semiconductor structure by the method of claim 1, and
   forming a semiconductor device from the semiconductor structure.

10. A method of making an electronic device, comprising:
    forming a semiconductor device by the method of claim 9, and
    forming an electronic device comprising the semiconductor device.

11. A method of making a semiconductor device, comprising:
    forming a semiconductor structure by the method of claim 8, and
    forming a semiconductor device from the semiconductor structure.

12. A method of making an electronic device, comprising:
    forming a semiconductor device by the method of claim 11, and
    forming an electronic device comprising the semiconductor device.

13. A method of removing a defect from a gate stack on a substrate, comprising:
    selectively oxidizing silicon in a gate stack, causing formation of the defect; and
    treating the gate stack with a plasma, to remove the defect;
    wherein the plasma comprises fluorine,
    the gate stack comprises
       a gate layer comprising the silicon, and
       a metallic layer, on the gate layer,
    the treating is carried out after stripping of any photoresist applied on the substrate, and before spacer deposition, and
    the defect is selected from the group consisting of a whisker defect and a bump defect.

14. The method of claim 13, wherein the plasma further comprises oxygen.

15. The method of claim 13, further comprising forming an insulating layer, on the metallic layer.

16. The method of claim 13, wherein the metallic layer comprises at least at least one member selected from the group consisting of tungsten, tantalum, titanium, nickel, molybdenum, nitrides thereof, suicides thereof or alloys thereof.

17. The method of claim 15, wherein the insulating layer comprises silicon nitride,
    the metallic layer comprises tungsten and titanium, and
    the gate layer comprises poly.

18. The method of claim 13, wherein the plasma is prepared from a process gas comprising at least one member selected from the group consisting of $CF_4$, $CHF_3$ and $NF_3$.

19. The method of claim 14, wherein the plasma is prepared from a process gas comprising:
    at least one member selected from the group consisting of $CF_4$, $CHF_3$ and $NF_3$,
    at least one member selected from the group consisting of $O_2$, water vapor, and $N_2O$, and
    nitrogen or a combination of nitrogen and hydrogen.

20. The method of claim 1, wherein the defect is selected from the group consisting of a whisker defect and a bump defect.

* * * * *

UNITED STATES PATENT AND TRADEMARK OFFICE
CERTIFICATE OF CORRECTION

| | |
|---|---|
| PATENT NO. | : 7,351,663 B1 |
| APPLICATION NO. | : 11/169176 |
| DATED | : April 1, 2008 |
| INVENTOR(S) | : Alex Kabansky et al. |

It is certified that error appears in the above-identified patent and that said Letters Patent is hereby corrected as shown below:

Col. 4, line 59, claim 4 please delete "at least" after comprises.
Col. 6, line 15, claim 16 please delete "at least" after comprises.
Col. 6, line 17, claim 16 please delete "suicides" and insert --silicides--.

Signed and Sealed this

Twenty-third Day of September, 2008

JON W. DUDAS
*Director of the United States Patent and Trademark Office*